United States Patent

Duff et al.

(12) United States Patent
(10) Patent No.: US 6,799,128 B2
(45) Date of Patent: Sep. 28, 2004

(54) MEASUREMENT SYSTEM FOR SAMPLING A SIGNAL AND EVALUATING DATA REPRESENTING THE SIGNAL

(75) Inventors: Christopher P Duff, Colorado Springs, CO (US); Marty Grove, Manitou Springs, CO (US); Allen Montijo, Colorado Springs, CO (US); Vivian Patlin, Colorado Springs, CO (US); David Poppe, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 112 days.

(21) Appl. No.: 10/284,743

(22) Filed: Oct. 31, 2002

(65) Prior Publication Data

US 2004/0088125 A1 May 6, 2004

(51) Int. Cl.[7] .................................. G01R 13/00
(52) U.S. Cl. ..................... 702/70; 702/66; 702/74; 702/190
(58) Field of Search ............... 702/57, 66, 70, 702/74, 124, 190; 324/76.18, 76.19, 76.21, 76.25

(56) References Cited

U.S. PATENT DOCUMENTS 4,697,088 A * 9/1987 Bishop .................. 250/559.36
6,684,169 B2 * 1/2004 Masella et al. ............... 702/66

* cited by examiner

*Primary Examiner*—Marc S. Hoff
*Assistant Examiner*—Paul L Kim

(57) ABSTRACT

A measurement system for analyzing data values that are stored in memory and that represent a sampled electrical signal under analysis (SUA). Each of the data values represents the SUA at respective points in time over a time interval during which the SUA was sampled. The stored data values constitute a main data record. The system includes processing logic that is configured to generate at least a first reduced data record from the main data record. The first reduced data record comprises a subset of the data values of the main data record. The first reduced data record is processed by the processing logic to locate an edge (i.e., a voltage transition) in the first reduced data record. Thus, it is not necessary that the main data record, which is more voluminous than the first reduced data record, be used to locate the edge. After the edge has been located, the processing logic processes a second set of data values of the main data record that is within boundaries in the main data record associated with the first reduced data set in order to analyze the edge. Thus, it is not necessary to process the entire main data record in order to analyze, or evaluate, an edge. Once the edge has been suitable located, all of the data of the main data record that is associated with the edge may be processed to analyze the edge.

19 Claims, 4 Drawing Sheets

MEASUREMENT SYSTEM FOR SAMPLING A SIGNAL AND EVALUATING DATA REPRESENTING THE SIGNAL

TECHNICAL FIELD OF THE INVENTION

The present invention relates to test equipment and, more particularly, to a measurement system that samples a signal, stores data representative of the signal in memory, and processes the data in a manner that facilitates fast evaluation of the signal or characteristics thereof.

BACKGROUND OF THE INVENTION

Electronic measurement devices are widely used by engineers and technicians across many industries for the purpose of analyzing, for example, electronic and/or optical signals. The speed and accuracy of such a measurement device has a direct impact on the timeliness within which a problem may be analyzed and addressed.

In recent years, there has been a growing need for measurement devices having the ability to store large volumes of data (i.e., a data record) representing a signal under analysis. These types of measurement devices are said to provide "deep memory records" representative of a signal under analysis. The greater the size of the data record representing the signal under analysis, the greater the ability of the measurement device to provide for display and measurement of the characteristics of a signal under analysis. Examples of measurement devices incorporating a deep memory record include the Hewlett Packard model 54622D oscilloscope, as well as the Agilent Infiniium oscilloscope models 54830D, 54831B and 54832B. These types of oscilloscopes are commonly referred to as deep memory oscilloscopes.

Unfortunately, large data records require time for the measurement device to process in order to carry out a desired measurement/evaluative process. Examples of relevant measurements/evaluative processes that may be carried out by the measurement device include edge measurements to determine rise time, fall time, period, frequency, duty-cycle, positive and negative pulse widths, delay between edges, phase, the time that an edge reaches a particular value, as well as many other types of measurements.

Once a portion of the signal under analysis has been identified as being of interest for evaluation, the entire data record stored in memory is accessed and acted on for purposes of carrying out the desired evaluation/ measurement. The portion of the signal to be analyzed may be identified by a user or by an algorithm that processes the data in a particular manner to find the portion of the signal of interest. Although only a portion of the signal under analysis is relevant and required to carry out the desired evaluation/measurement, the entire data record (and not just relevant portions thereof) is retrieved from memory and processed to carry out the desired measurement/evaluation. Processing all of the data in the data record consumes a large amount of time and computational resources.

Another known deep memory oscilloscope runs edge measurements on a compressed data record. Although the compressed data record is smaller than the original deep memory data record, and thus can be processed faster, the edge measurements are not as accurate as when the entire deep memory data record is used to locate and measure an edge.

It would be desirable to provide a measurement system that is capable of processing large volumes of data, such as deep memory data, for example, in such a way that a signal, or a portion thereof, can be evaluated quickly and with relatively low processing overhead. Accordingly, a need exists for a measurement system that is capable of sampling and evaluating a signal efficiently with relatively low computational intensity, thereby enabling the evaluation process to be performed quickly without over-utilization of computational resources.

SUMMARY OF THE INVENTION

The present invention provides a measurement system for analyzing data values that are stored in memory and that represent a sampled electrical signal under analysis (SUA). Each of the data values represents the SUA at respective points in time over a time interval during which the SUA was sampled. The stored data values constitute a main data record. The system includes processing logic that is configured to generate at least a first reduced data record from the main data record. The first reduced data record comprises a subset of the data values of the main data record. The first reduced data record is processed by the processing logic to obtain boundaries in the main data record that correspond to a bounded region of the SUA that may or may not include an edge (i.e., a voltage transition). The data values within these boundaries correspond to the first reduced data record. Because only these data values are used to locate the edge, as opposed to using all of the data values of the main data record, the edge can be located quickly and easily.

In order to analyze the edge after it has been located, the processing logic processes a second set of data values of the main data record, which may be the entire main data record or a subset thereof. The second set of data values includes one or more data values of the main data record that are not included in the first set of data values, and is larger than the first set of data values. Using a larger number of data values to evaluate the edge ensures that a sufficient number of data values are used so that the evaluation is precise.

If desired or deemed necessary, additional reduced data records may also be generated from the main data record and processed to more closely locate the edge. Once the final bounded set of data values to be used in the evaluation has been obtained, preferably all of the data values of the main data record that are within the boundaries associated with the bounded set are processed to evaluate the SUA.

Other features and advantages of the present invention will become apparent to one with skill in the art upon examination of the following drawings and detailed description.

DETAILED DESCRIPTION OF THE PREFERRED EMBODIMENT

The present invention is directed to a measurement system, such as, for example, a deep memory oscilloscope, for evaluating a signal under analysis (SUA). In accordance with the present invention, the main deep memory data record representative of the sampled signal is not used to evaluate the SUA (e.g., to locate a rising or falling edge). Rather, one or more reduced data records are derived from the main data record, and then the reduced data record(s) is used to locate boundaries about the portion of interest of the SUA. Once the boundaries have been located, the main data record associated with the portion of interest of the SUA is used to evaluate the portion of interest of the SUA (e.g., to find a rising or falling edge). Because the main data record is not processed until the reduced data record has been used to bound the portion of the SUA of interest, significant reductions in evaluation time and processing overhead are achievable.

The measurement system of the present invention preferably is configured to sample the SUA to obtain a main data record (i.e., a deep memory record) representative of the SUA, generate one or more reduced data records based on the main data record, store the main and reduced data record(s) in memory, and evaluate the signal or portions thereof based on the stored data records. The manner in which the measurement system performs these tasks will now be described with reference to FIGS. 1–4.

Figure 1:
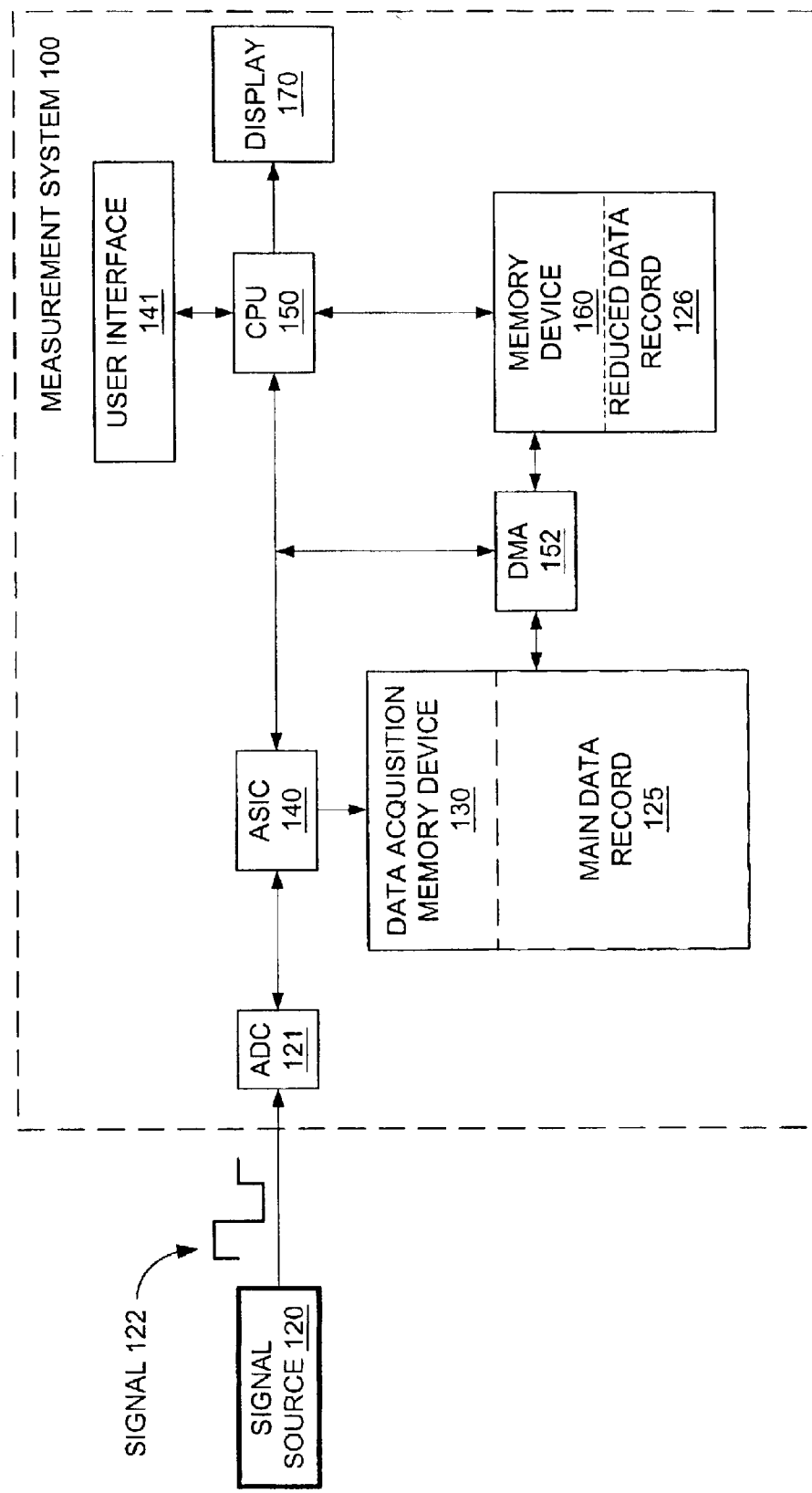
FIG. 1 illustrates a block diagram of the measurement system of the present invention in accordance with an example embodiment.

FIG. 1 illustrates an example embodiment of the measurement system 100 of the present invention. The measurement system 100 receives a signal 122 that is generated by a signal source 120. This signal 122 will be referred to herein as the signal under analysis (SUA) 122. Signal source 120 may be, for example, a signal generator, or any electrical conductor via which an electrical signal can travel or otherwise be propagated. The signal source 120 may also be, for example, a light source or a source for generating an acoustical waveform. If the signal is not an electrical signal, it will be converted into an electrical signal prior to being processed by the measurement system 100.

The measurement system 100 comprises an analog-to-digital converter (ADC) 121 that samples the signal 122 generated by the signal source 120 and converts the signal 122 into a digital representation of the signal 122. The digital representation of the signal 122 is stored in a data acquisition memory device 130. The memory device 130 preferably is a very fast memory device so that data can be written to it and read from it at a very high rate of speed. Preferably, an application specific integrated circuit (ASIC) 140 controls the writing of the sampled data to the memory device 130 and the reading of data from the memory device 130. The ASIC 140 preferably is configured to operate at very high data rates, and the combination of the ASIC 140 and the high-speed memory device 130 enables the measurement system 100 to operate at a very high rate of speed.

The ASIC 140 receives instructions from a central processing unit (CPU) 150. The CPU 150 receives instructions from a user interface 141. In accordance with these instructions, the ASIC 140 reads the portion of the main data record 125 out of memory device 130 that corresponds to input received from the user interface 141. The ASIC 140 then generates a reduced data record 126 from the portion of the main data record 125 read from memory device 130. The reduced data record 126 generated by the ASIC 140 is stored in memory device 160, which preferably is a fast random access memory (RAM) device. The user input to the user interface 141 identifies a portion of the SUA 122 that is of interest and the manner in which the SUA 122 is to be evaluated. In general, the user input may be indicative of, for example, a time (time point), or span of time, along the duration of the SUA 122. The user input may also identify, for example, a frequency or range of frequencies associated with the SUA 122.

The CPU 150 processes the user input to determine the boundaries of the portion of interest of the SUA 122. These boundaries indicate the beginning and the end of the portion of interest of the SUA 122. The ASIC 140, in accordance with instructions received from the CPU 150, reads the portion of the main data record 125 from memory device 130 corresponding to these boundaries. The ASIC 140 then generates a reduced data record 126, which is stored in memory device 160 by the DMA 152. The reduced data record 126 stored in memory device 160 is processed by the CPU 150 in the manner discussed below to find the edge(s) being sought and to evaluate the signal 122. The portion of the main data record 125 that the reduced data record 126 is based on may be transferred from memory device 130 and stored in memory device 160 so that it can be accessed and processed by the CPU 150 if necessary or desired. The manner in which the reduced data record(s) 126 is generated by the ASIC 140 and the manner in which the CPU 150 processes data records are described below in detail with reference to FIGS. 2–4.

It should be noted that the measurement system 100 represented by the block diagram shown in FIG. 1 is only an example of one possible configuration of a measurement system that can be used to accomplish the goals of the present invention. Many of the features of the measurement system described above have been employed for the purpose of enabling the evaluation process to be performed efficiently and quickly. For example, the CPU 150 could be used to perform the functions of the ASIC 140, which would allow the ASIC 140 to be eliminated. The CPU 150 may be any type of processor, such as a microprocessor, for example. Also, the DMA 152 is not necessary, but is preferred because it reduces the amount of time required to transfer data from memory device 130 to memory device 160. Also, although two memory devices preferably are implemented, a single memory device could be used for storing all of the data.

The measurement system 100 may be configured to define the boundaries of, for example, the first edge within the main data record. It will be recognized by those skilled in the art that the edge does not necessarily have to be the first edge in the main data record. Any edge designation considered appropriate for the process is valid. The measurement/evaluative process can be carried out upon a subset, i.e., a portion, of the main data record 125. The subset can be designated by the user or by the predetermined requirements of the measurement/evaluative process that the system 100 is configured to perform. An example of a user designation might be setting up two markers on the signal displayed on a display device 170 indicating the portion of the signal that the user wants to analyze. Another example of a designation that could be communicated to the system 100 via the user interface 141 would be to find all edges displayed on screen of the display 170.

Figure 2:
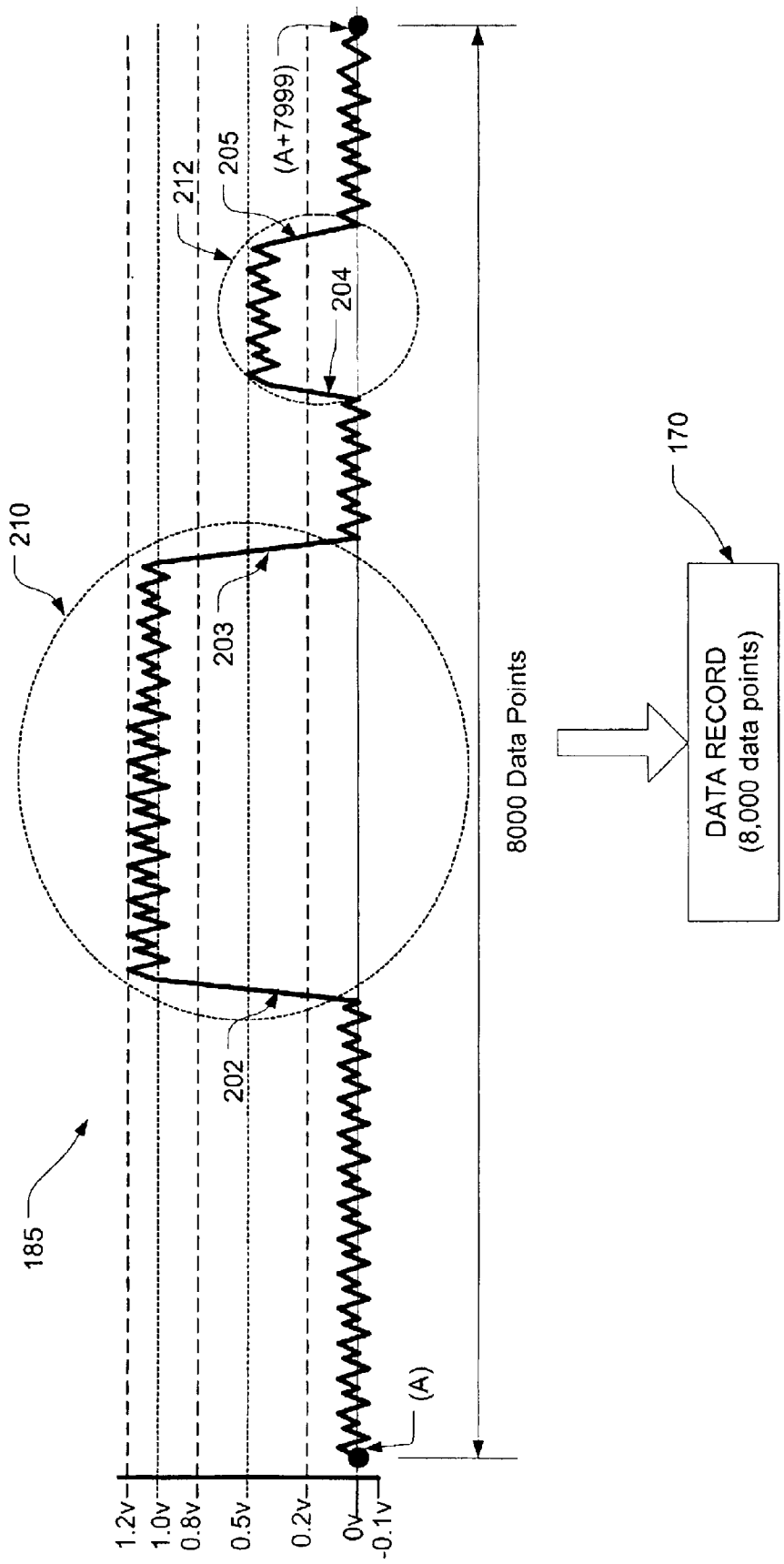
FIG. 2 is a graph showing a plot an example signal under analysis (SUA).

FIG. 2 illustrates an example of a waveform 185 that is representative of a SUA 122. The waveform 185 is representative of the SUA 122 for a given time period and depicts the value of the SUA 122 over this time period. In this example, the time period of the SUA 122 is indicated by the span between time point (A) and time point (A+7999). The waveform 185 has values that range from a minimum of approximately −0.1 volts to a maximum of approximately +1.2 volts. The waveform 185 is characterized by two spikes (or pulses) 210 and 212. Spike 210 is characterized by rising edge 202 and falling edge 203. The values represented by spike 210 range from a minimum of approximately −0.1 volts to a maximum value of approximately +1.2 volts.

Spike 212 is characterized by rising edge 204 and falling edge 205. The values represented by spike 212 range from a minimum of approximately −0.1 volts to a maximum value of approximately +0.5 volts. Other portions of this example waveform 185 are generally in the range of approximately −0.1 volts to +0.1 volts.

The measurement system 100 receives the SUA 122 and samples it at a predetermined sampling rate to generate a data record 125 that is representative of the SUA 122. This main data record 125 is comprised of data representing values for the SUA 122 for the period of time that the SUA is sampled. In the example shown in FIG. 2, the time period is represented by the span between time point (A) and time point (A+7999). In this example, the data record 125 represents 8000 data entries, with each data entry being representative of the value of the SUA 122 at a given time within the time period represented by the span between time point (A) and time point (A+7999). After the main data record 125 has been generated, one or more reduced data records 126 can be derived from the main data record 125. The manner in which this is accomplished will now be described with reference to FIG. 3.

Figure 3:
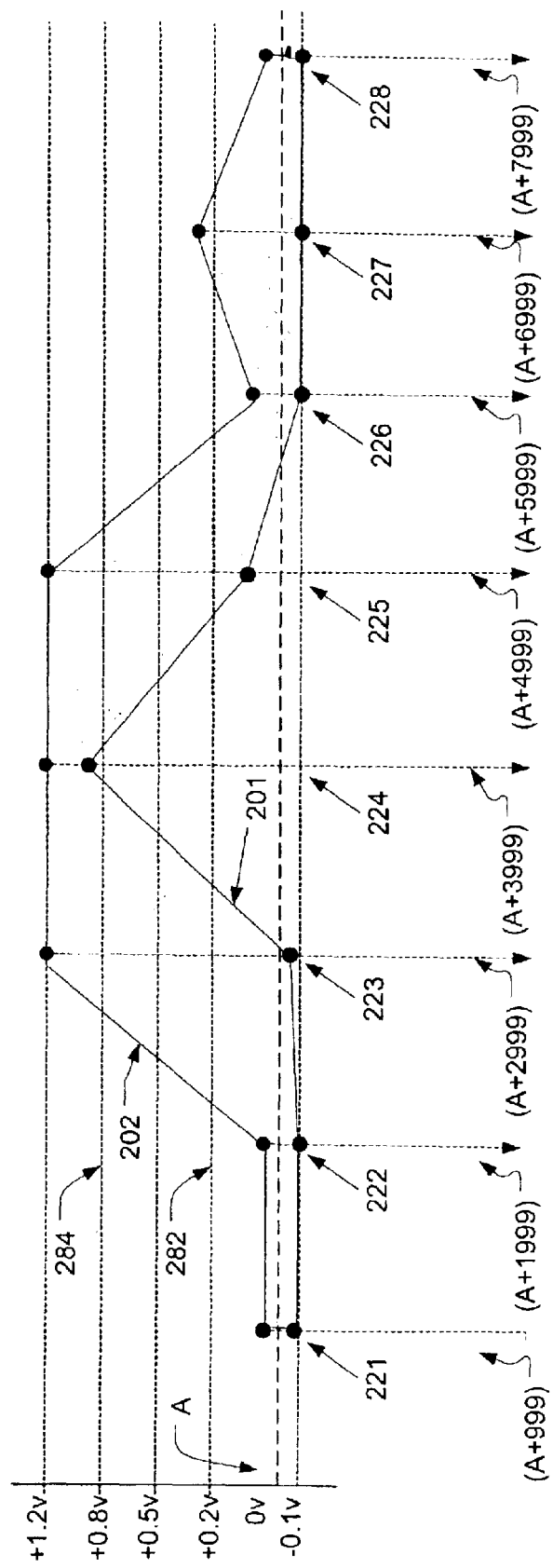
FIG. 3 is a graph on which points corresponding to a reduced data set are plotted.

FIG. 3 is a graphical representation of a waveform corresponding to a reduced data record 126. Each entry in the reduced data record 126 is representative of multiple data entries in the portion of the main data record 125 that was used to generate the reduced data record 125. For example, if the main data record 125 contains 8000 data entries, representing 8000 values for the SUA 122 over a given period of time, the reduced data record 126 may contain, for example, only 8 data entries. In this case, each data entry of the 8 data entries contained in the reduced data record 126 is representative of 1000 data entries in the main data record 125. In this case, it could be said that a reduction ratio of 1000:1 has been applied to the main data record 125 in order to generate the reduced data record 126. It will be recognized by those skilled in the art, in view of the present disclosure, that other reduction ratios may also be used, as may be desired or needed to meet a particular requirement. Also, it should be noted that a typical main data record 125 may actually contain millions or billions of data entries. However, for example purposes and for ease of illustration, the main data record 125 described herein has been limited to a relatively small number of data entries.

As will be understood by those skilled in the art in view of the discussion provided herein, the reduced data record 126 may be derived from the main data record by using any one or more of a plurality of techniques (e.g., decimation, interpolation, estimation, etc.) to reduce the amount of data contained in the main data record 125 in order to produce the reduced data record 126. In accordance with an example embodiment, a reduction ratio is used to reduce the amount of data (e.g., 1000:1). In accordance with the example provided above in which each of the 8 entries in the reduced data record 126 represents 1000 of the 8,000 entries in the main data record 125, respective minimum and maximum data values are obtained from the main data record 125 for each of 8 respective time intervals. Thus, each of the 8 entries in the reduced data record 126 has a minimum and a maximum value associated with it. As can be seen in FIG. 3, the time intervals are equal, each being 1,000 time units in length. However, it is not necessary that the time intervals be equal in length.

In FIG. 3, at the end of each time interval, two points are shown. The lower of the two points (i.e., the point corresponding to the lower voltage level) corresponds to the minimum value associated with the respective time interval and the upper of the two points corresponds to the maximum value associated with the respective time interval. The lower points are shown as being connected to form plot 201. Likewise, the upper points are shown as being connected to form plot 202. In order for the measurement system 100 to fund an edge, the CPU 150 determines, for each time interval, if the corresponding maximum value is above an upper, preselected threshold and if the corresponding minimum value is below a lower, preselected threshold value. If the result of both of these determinations is true, then a determination is made by the measurement system 100 that a potential edge has been located.

In this example, a lower threshold of +0.2 volts is used and an upper threshold of +0.8 volts is used. Dashed line 282 corresponds to the lower threshold and dashed line 284 corresponds to the higher threshold. In this example, in order for a transition in the value of the SUA to qualify as an "edge" (either rising or falling), the range of values of the SUA 122 must include at least one low value that is below the lower threshold 282 of +0.2 volts and at least one high value that is above the upper threshold 284 of +0.8 volts. It should be noted that the upper and lower thresholds 282 and 284 may be established at any level as may be desired or appropriate.

FIG. 3 shows the minimum and maximum values for 8 time intervals. The minimum and maximum values at the end of the first time interval, which is represented by point 221, are both below the lower threshold 282. Therefore, a determination is made that there is no edge in the time interval from initial time point (A) up to the time point (A+999). Point 222 corresponds to data values from the time point (A+1000) up to the time point (A+1999). Again, because the minimum and maximum values associated with this data entry are both below the lower threshold 282, a determination is made that a potential edge has not been located. Point 223 corresponds to data values from the time point (A+2000) up to the time point (A+2999) and indicates a minimum value of −0.1 volts and a maximum value of +1.2 volts. Because the minimum value is below the lower threshold and the maximum value is above the upper threshold, a determination is made that a potential edge has occurred during this time interval.

Point 224 corresponds to data values from the time point (A+3000) up to the time point (A+3999) and indicates a minimum value of +0.9 volts and a maximum value of +1.2 volts. Although the maximum value is above the upper threshold 284, the minimum value is not below the lower threshold 282. Therefore, a determination is made that no edge has occurred during this time interval. This process occurs for each time interval designated by points 221–228 until the edge(s) being sought is or is not found. It should be noted that rising and falling edges can easily be distinguished from each other by determining whether the minimum value occurred at a point in time before the point in time at which the maximum value occurred. For example, for the transition between the points in time designated points 222 and 223, the minimum value at the beginning of the transition occurs at time point between (A+1000) and (A+1999), whereas the maximum value at the end of the transition occurs at a later time point between (A+2000) and (A+2999). In contrast, for the transition between the points in time designated points 225 and 226, the maximum value at the beginning of the transition occurs at a time point between (A+4000) and (A+4999), whereas the minimum value at the end of the transition occurs at the later time point between (A+5000) and (A+5999).

As stated above, the boundaries of the portion of the signal 122 to be evaluated are initially determined by the CPU 150 in accordance with data input by a user via the user interface 141. Once a determination is made that a potential edge exists, the boundaries are refined by the CPU 150 to more closely bound the region of interest. For example, if a rising edge is being sought, the initial window may include the entire portion of the signal from time (A) to (A+7999). However, once the rising edge corresponding to the transition between point 222 and point 223 has been found using the minimum and maximum values in the manner discussed above, the boundaries can be refined so that only the portion of the signal corresponding to the transition of interest is bounded. For example, the boundaries can be refined to include data corresponding to the portion of the signal from time (A+1000) and just after time (A+2999). By refining the boundaries in this manner, the portion of the main data record 125 that needs to be processed is reduced.

With the refined boundaries, either the portion of data in the main data record 125 within the boundaries can be processed to determine whether the signal characteristic being sought is truly within the bounded area, or another reduced data record 126 derived from the portion of the main data record 125 within the boundaries can be generated. It may be faster to generate and evaluate another reduced data record 126 rather than evaluating the portion of the main data record 125 within the boundaries. Each subsequent reduced data record will have a smaller reduction ratio than the immediately preceding reduced data record to enable the bounded portion of the data to be more precisely evaluated. For example, if the immediately preceding reduction ratio was 1,000:1, then the subsequent reduction ratio may be, for example, 100:1. As indicated above, this new reduction ratio will be applied only to the portion of the main data record 125 within the refined boundaries.

The present invention is not limited with respect to the number of reduced data records that are generated or with respect to how the corresponding reduction ratio is chosen. The advantage of iteratively generating and evaluating reduced data records for the bounded portion of data is that the iterative process makes it possible to determine whether the signal feature or characteristic being sought is or is not present in the bounded region without having to process the portion of the main data record 125 that corresponds to the bounded region, which may be a large volume of data. Also, with each iteration, the boundaries can be further refined.

If processing one or more reduced data records 126 for a bounded region does not enable a determination to be made as to whether the signal feature or characteristic being sought is or is not present in the bounded region, then the portion of the main data record 125 corresponding to the portion of the signal within the refined boundaries is processed in order to make the determination. A determination is then made as to whether the edge being sought is within the bounded region by comparing the minimum and maximum data values for each time interval to upper and lower threshold values in the manner discussed above with reference to FIG. 3.

Figure 4:
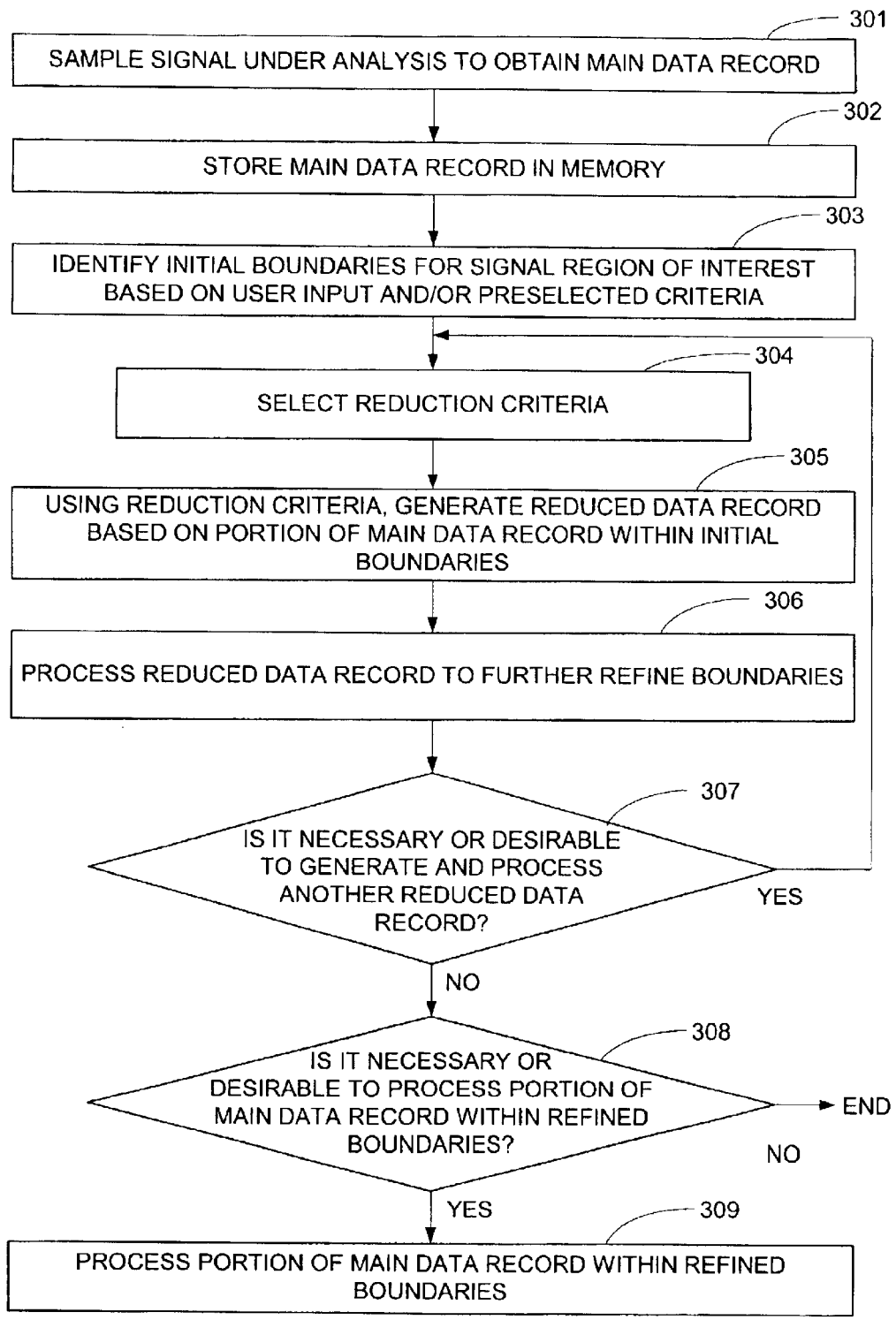
FIG. 4 illustrates a flowchart of an example embodiment for performing the method of the present invention.

FIG. 4 illustrates a flow chart of the method of the present invention in accordance with the preferred embodiment. As the SUA 122 (FIG. 1) is received by the measurement system 100, it is sampled by ADC 121 (FIG. 1) and stored in memory device 130 as the main data record 125. These steps are represented by the blocks 301 and 302 in the flow chart. As stated above, initial boundaries for the portion of the SUA 122 to be evaluated are set based on user input and/or in accordance with any pre-configuration of the measurement system 100. This step is represented by block 303 in the flow chart. The ASIC 140 causes the main data record 125 to be read from data acquisition memory device 130 and generates a reduced data record 126 using reduction criteria provided to the ASIC 140 by the CPU 150. These steps are represented by blocks 304 and 305. The reduced data record 126 is then processed by the CPU 150 to refine the boundaries about the portion of the signal data of interest, as indicated by block 306. It should also be noted that during this step, sufficient data may be in the reduced data record 125 to enable the CPU 150 to determine whether the edge being sought is within the refined boundaries, and if so, to precisely locate the edge.

As stated above, if desired or deemed necessary, multiple reduced data records 126 can be generated and processed by applying increasingly smaller reduction ratios to the portion of the main data record 125 within the refined boundaries, as indicated by block 307 and the arrow from block 307 to block 304. After the designated number (i.e., 1 or more) of reduced data records 125 have been generated and processed, a determination is made as to whether it is necessary or desirable to then process the portion of the main data record that is within the refined boundaries, as indicated by block 308. As stated above, it is possible that a determination can be made as to whether the edge being sought is or is not within the bounded region by processing only one reduced data record, or multiple reduced data records. Therefore, the evaluation process may be complete at the point in the process represented by block 308. However, in most cases it will be desirable to process the portion of the main data record 125 within the refined boundaries to ensure that the results of the evaluation are precise. Therefore, the process will, in most cases, proceed to the step represented by block 309 during which the corresponding portion of the main data record is processed to complete the evaluation.

As stated above, in accordance with the preferred embodiment, the measurement system 100 is an oscilloscope. However, the measurement system 100 may also be configured to operate as a spectrum analyzer, as a logic analyzer or any other type of device that is used for measurement or analysis of a signal. As stated above, the present invention is particularly well suited for use in evaluating signals represented by a very large amount of data. It should also be noted that the measurement system 100 is not limited to any particular configuration. As indicated above in the discussion of the ASIC 140 and the CPU 150, the measurement system 100 can be implemented in hardware, such as an ASIC, for example, in software being executed by a processor, such as CPU 150, for example, in firmware, such as a field programmable gate array (FPGA), for example, or as a combination thereof. It should be noted that the above-described embodiment of the measurement system 100 is an example of one possible implementation or configuration of the measurement system 100. Similarly, the embodiment of the evaluation method of the present invention is only one example of the manner in which the evaluation process can be performed. Many variations and modifications may be made to the above-described embodiments, and all such modifications and variations are within the scope of the present invention.

What is claimed is:

1. A measurement system comprising:
    data storage logic having data values stored therein that represent a sampled electrical signal under analysis (SUA), at least a portion of the stored data values corresponding to a main data record; and
    processing logic configured to generate at least a first reduced data record from the main data record and to process said at least a first reduced data record to locate an edge in said at least a first reduced data record, said at least a first reduced data record being a first set of data values of the main data record, the edge corresponding to a transition in the electrical signal, and wherein the processing logic is also configured to process a second set of data values from the main data record that are associated with the edge in order to analyze the edge, the second set of data values including one or more data values of the main data record that are not included in the first set of data values, the quantity of the second set of data values being greater than the quantity of the first set of data values;

wherein the processing logic is further configured to generate at least a second reduced data record from the main data record and to process the second reduced data record to locate data values in the second reduced data record that correspond to said edge, and wherein a ratio of the total number of data values of the main data record to the total number of data values of the first reduced data record is greater than a ratio of the total number of data values of the main data record to the total number of data values of the second reduced data record, and wherein the first and second reduced data records are generated and processed to locate an edge before the main data record is processed to evaluate the edge;

wherein the second reduced data record is processed by grouping data values of the main data record into groups of data values, each group associated with the second reduced data record having a minimum data value and a maximum data value, and wherein the processing logic determines whether an edge has been located by comparing the maximum and minimum data values of a particular group associated with the second reduced data record with one or more threshold values, and wherein the second reduced data record comprises more data values than the first reduced data record, and wherein the first and second data records are processed before the main data record is processed.

2. The measurement system of claim 1, further comprising:

a user interface in communication with the processing logic, the user interface being configured to receive input from a user, to process the user input into measurement parameters and to output the measurement parameters to the processing logic, the measurement parameters including boundaries that indicate to the processing logic the data values stored in the storage logic that are within the boundaries, and wherein only the stored data values within the boundaries are included in the main data record.

3. The measurement system of claim 1, wherein the first reduced data record is processed by grouping data values of the main data record into groups of data values of the main data record, each group having a minimum data value and a maximum data value, and wherein the processing logic determines whether an edge has been located by comparing the maximum and minimum data values of a particular group with one or more threshold values.

4. The measurement system of claim 1, wherein the second reduced data record is processed after the first reduced data record is processed.

5. The measurement system of claim 1, wherein each respective group corresponds to data values obtained by sampling the SUA over respective time intervals during a signal-sampling period.

6. The measurement system of claim 1, wherein the processing logic includes a microprocessor that is programmed to execute one or more computer programs for performing tasks associated with processing the data values.

7. The measurement system of claim 6, wherein at least one of the programs executed by the microprocessor causes the microprocessor to generate said at least a first reduced data record from the main data record.

8. The measurement system of claim 1, wherein the processing logic includes an application specific integrated circuit (ASIC) that is configured to perform tasks associated with generating said at least a first data record.

9. A method for analyzing a signal, the method comprising the steps of:

storing data values that represent a sampled electrical signal under analysis (SUA) in a memory device, at least a portion of the stored data values corresponding to a main data record;

generating at least a first reduced data record from the main data record;

processing said at least a first reduced data record in processing logic, the processing logic being configured to locate an edge in said at least a first reduced data record, said at least a first reduced data record being a first set of data values of the main data record, the edge corresponding to a transition in the electrical signal;

processing a second set of data values of the main data record in the processing logic after the edge has been located in order to analyze the edge, the second set of data values including one or more data values of the main data record that are not included in the first set of data values, the quantity of the second set of data values being greater than the quantity of the first set of data values;

with the processing logic, generating at least a second reduced data record from the main data record; and with the processing logic, processing the second reduced data record to locate data values in the second reduced data record that correspond to said edge, and wherein a ratio of the total number of data values of the main data record to the total number of data values of the first data record is larger than a ratio of the total number of data values of the main data record to the total number of data values of the second data record, and wherein the first and second data records are generated and processed to locate the edge before the main data record is processed to analyze the edge;

wherein the second reduced data record is processed by grouping data values of the main data record into groups of data values, each group associated with the second reduced data record having a minimum data value and a maximum data value, and wherein the processing logic determines whether an edge has been located by comparing the maximum and minimum data values of a particular group associated with the second reduced data record with one or more threshold values, and wherein the second reduced data record comprises more data values than the first reduced data record, and wherein the first and second data records are processed to locate the edge before the main data record is processed to evaluate the edge.

10. The method of claim 9, further comprising the steps of:

receiving user input at a user interface, the user interface being configured to process the user input into measurement parameters and to output the measurement parameters to said processing logic, the measurement parameters including boundaries that indicate to the processing logic the data values stored in the storage logic that are within the boundaries, and wherein only the stored data values within the boundaries are included in the main data record.

11. The method of claim 9, wherein the processing logic performs the step of processing the first reduced data record by grouping data values of the main data record into groups of data values of the main data record, each group having a minimum data value and a maximum data value, and wherein the processing logic determines whether an edge has been located by comparing the maximum and minimum data values of a particular group with one or more threshold values.

12. The method of claim 11, wherein the second reduced data record is processed after the first reduced data record is processed.

13. The method of claim 11, wherein each respective group corresponds to data values obtained by sampling the SUA over respective time intervals during a signal-sampling period.

14. The method of claim 11, wherein the processing logic includes a microprocessor that is programmed to execute one or more computer programs for performing tasks associated with processing the data values.

15. The measurement system of claim 11, wherein at least one of the programs executed by the microprocessor causes the microprocessor to perform the generating step.

16. A computer program for processing data values that represent a sampled electrical signal under analysis (SUA), the computer program being embodied on a computer-readable medium, the program comprising:

a first code segment for storing the data values in a memory device, at least a portion of the stored data values corresponding to a main data record;

a second code segment for generating at least a first reduced data record from the main data record;

a third code segment for processing said at least a first reduced data record in processing logic, the processing logic being configured to locate an edge in said at least a first reduced data record, said at least a first reduced data record being a first set of data values of the main data record, the edge corresponding to a transition in the signal;

a fourth code segment for processing a second set of data values of the main data record in the processing logic after the edge has been located in order to analyze the edge, the second set of data values including one or more data values of the main data record that are not included in the first set of data values, the second set of data values being larger than the first set of data values;

a fifth code segment for generating at least a second reduced data record from the main data record and for processing the second reduced data record to locate data values in the second data record that correspond to said edge, and wherein a ratio of the total number of data values of the main data record to the total number of data values of the first data record is larger than a ratio of the total number of data values of the main data record to the total number of data values of the second data record, and wherein the first and second reduced data records are generated and processed to locate an edge before the main data record is processed to evaluate the edge; and a sixth code segment for processing the second reduced data record by grouping data values of the main data record into groups of data values, each group associated with the second reduced data record having a minimum data value and a maximum data value, and wherein the sixth code segment determines whether an edge has been located by comparing the maximum and minimum data values of a particular group associated with the second reduced data record with one or more threshold values and wherein the second reduced data record comprises more data values than the first reduced data record, and wherein the first and second data records are processed before the main data record is processed.

17. A method for analyzing a signal, the method comprising:

storing a main data record, the main data record including a first number of data points of a signal sampled over a first time period;

dividing the first time period into a plurality of refined time intervals;

generating a reduced data record from the main data record, the reduced data record including one data entry for each refined time interval, each data entry including an upper data point and a lower data point, the upper data point corresponding to a maximum data point of the data points of the main data record within the respective time interval and the lower data point corresponding to a minimum data point of the data points of the main data record within the respective time interval; and locating an edge of the signal within one of the refined time intervals by determining when a respective data entry includes an upper data point above an upper predetermined threshold and a lower data point below a lower predetermined threshold.

18. The method of claim 17, further comprising:

generating a second reduced data record from the main data record, the second reduced data record including data points within a refined time interval that includes an edge; and analyzing the edge of the signal.

19. The method of claim 17, further comprising:

locating a second edge within another one of the refined time intervals.

* * * * *